United States Patent
Morton et al.

(10) Patent No.: US 6,262,392 B1
(45) Date of Patent: Jul. 17, 2001

(54) PRINTED CIRCUIT BOARDS

(75) Inventors: Edward Peter Morton; Andrew Peter James Guiver, both of Basingstoke (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/529,312

(22) PCT Filed: Oct. 13, 1998

(86) PCT No.: PCT/GB98/03077

§ 371 Date: Jun. 19, 2000

§ 102(e) Date: Jun. 19, 2000

(87) PCT Pub. No.: WO99/20088

PCT Pub. Date: Apr. 22, 1999

(30) Foreign Application Priority Data

Oct. 13, 1997 (GB) .................................................... 9721706

(51) Int. Cl.[7] ...................................................... H05B 1/00
(52) U.S. Cl. .......................... 219/209; 219/210; 219/543; 361/721
(58) Field of Search ..................................... 219/209, 210, 219/543, 548; 361/78, 103, 719, 720, 721, 722; 174/250, 255, 258, 260

(56) References Cited

U.S. PATENT DOCUMENTS

| | | | |
|---|---|---|---|
| 3,289,046 | * | 11/1966 | Carr ........................................ 219/209 |
| 3,395,265 | * | 7/1968 | Weir ........................................ 219/209 |
| 3,440,407 | * | 4/1969 | Goltsos et al. ........................ 219/209 |
| 3,816,702 | * | 6/1974 | Green .................................... 219/209 |
| 4,374,316 | * | 2/1983 | Inamori et al. ....................... 219/209 |
| 4,481,403 | * | 11/1984 | Del Monte ............................ 219/209 |
| 5,010,233 | | 4/1991 | Henschen et al. . |
| 5,103,071 | | 4/1992 | Henschen et al. . |
| 5,130,842 | * | 7/1992 | Gauthier et al. ..................... 219/209 |
| 5,268,558 | | 12/1993 | Youssef et al. . |
| 5,302,810 | * | 4/1994 | Gauthier et al. ..................... 219/543 |
| 5,539,186 | * | 7/1996 | Abrami et al. ....................... 219/548 |
| 5,574,627 | * | 11/1996 | Porter ................................... 219/209 |
| 5,645,123 | | 7/1997 | Doi et al. . |
| 5,896,259 | * | 4/1999 | Farwell et al. ....................... 219/209 |

FOREIGN PATENT DOCUMENTS

| | | |
|---|---|---|
| 23 54 719 | 5/1975 | (DE) . |
| 23 62 567 | 6/1975 | (DE) . |
| 0 795 902 A2 * | 4/1997 | (DE) . |
| 0 800 102A1 | 10/1997 | (EP) . |
| 2 300 340 | 10/1996 | (GB) . |

* cited by examiner

Primary Examiner—Sang Paik
Assistant Examiner—Fadi H. Dahbour
(74) Attorney, Agent, or Firm—Burns, Doane, Swecker & Mathis, L.L.P.

(57) ABSTRACT

A printed circuit board (1) includes a multi-layered structure. One of the layers (3) provides a heating layer such that heat applied to that layer (3) is transferred to electronic components (2) mounted on the board (1). The components (2) can thus be maintained at a suitable operating temperature. The heat can be supplied by ohmic heating of a resistive element within the printed circuit board (1). In an exemplary embodiment of the invention, one of a conducting layer and a ground or earthing layer of the printed circuit board (1) provides the heating layer (3).

1 Claim, 1 Drawing Sheet

PRINTED CIRCUIT BOARDS

TECHNICAL FIELD OF THE INVENTION

The present invention relates to printed circuit boards and in particular to a method and apparatus for heating selected areas of a printed circuit board.

DESCRIPTION OF THE RELATED ART

In order to keep electronic components working reliably, they must be maintained within their desired operating temperature range. This is a particular problem in remote cellular or satellite telephony base stations, which may be required to operate in extreme climatic conditions. In such conditions, components having wide operating temperature ranges have conventionally been used. However, such components are expensive.

U.S. Pat. No. 5,103,071 discloses a surface mount technology heater which is used to provide heat to a circuit board in order to solder surface mount connector terminals to contact pads. The connector terminals are configured as spaced integrally formed projections of a selectively actuable heater. The heater develops thermal energy which is conducted along the projections to the solder tails to melt fusable conductive material.

However, such a heater is only used to solder terminals to a PCB, and is not suitable for use in heating electronic components mounted on the PCB during operation.

SUMMARY OF THE PRESENT INVENTION

In accordance with the invention, means are provided for heating a temperature-sensitive component on a PCB, to maintain it within a desired operating temperature range.

According to a first aspect of the present invention, there is provided a printed circuit board comprising a multi-layered structure. One of the layers of the structure provides a heating layer such that heat applied to that layer is transferred to electronic components mounted on the printed circuit board.

According to a second aspect of the present invention there is provided a method of heating electronic components mounted on a printed circuit board. The method comprises supplying thermal energy to a layer of the printed circuit board.

Preferably, heat is supplied by ohmic heating of a resistive element within the printed circuit board.

Advantageously, the temperature of the components is detected, and the sensed temperature is used to control the supply of heat thereto.

DETAILED DESCRIPTION OF THE PREFERRED EMBODIMENT

Figure 1:
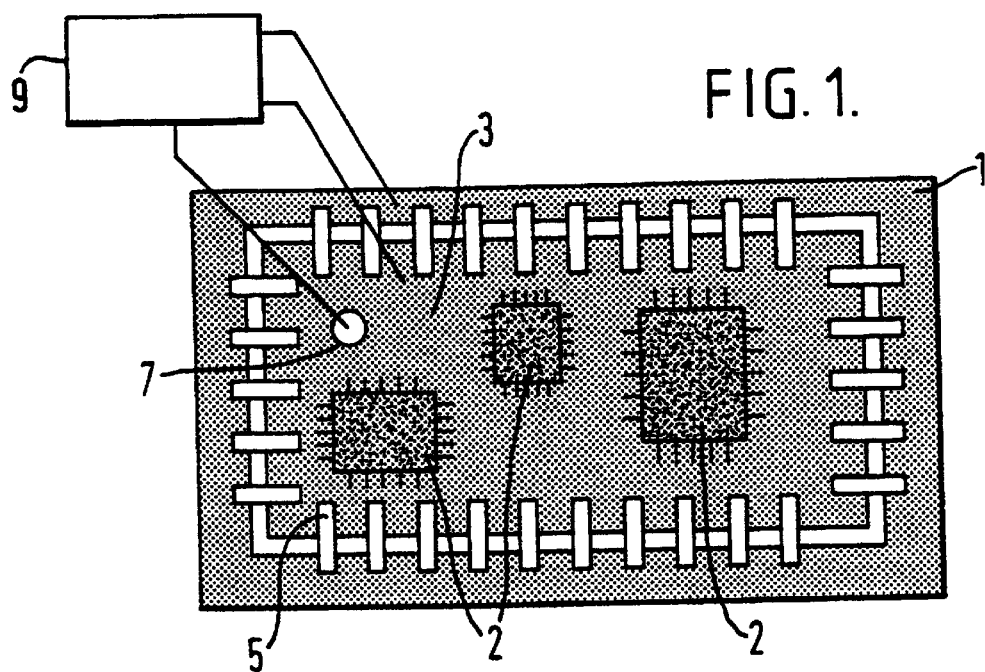
FIG. 1 shows a schematic view of a first printed circuit board embodying the present invention.

Referring to FIG. 1, a printed circuit board (PCB) 1 has a number of electronic components 2 mounted thereon. The PCB 1 is generally of conventional construction, i.e. having a substrate layer, a conduction layer, a ground layer and insulating layers. The conduction and ground layers are usually copper and are configured to provide appropriate connections between the electronic components 2 mounted on the PCB 1.

In particular, these components, which may for example be integrated circuits or may be discrete devices, may be such that they only operate satisfactorily within a specific temperature range (e.g. 0° C.–70° C.). needs to be operable in harsh climatic conditions, for example in temperatures well below 0° C.

A number of surface mount resistors, for example 0.25 watts, are mounted around the PCB 1, in contact with a heating layer 3 which is shown as an upper layer of the PCB 1. A temperature sensor 7 is also mounted on the PCB 1 and provides a temperature signal to a controlled voltage source 9. The controlled voltage source 9 is connected to the surface mount resistors 5 in order to provide a controlled voltage to those resistors 5.

In order to heat the electronic components 2 mounted on the PCB 1, and thus maintain them within their operating temperature range, a voltage is supplied to the surface mount resistors 5 by the controlled voltage source 9. This causes the surface mount resistors 5 to heat up by ohmic heating, thereby transferring heat to the heating layer 3 of the PCB 1. Heat is then transferred to the electronic components 2 mounted on the PCB 1.

The temperature sensor 7 provides a temperature signal to the controlled voltage source 9 in order to regulate the voltage supplied to the surface mount resistors 5. The temperature of the PCB 1 and the electronic components 2 can therefore be controlled.

The surface mount resistors 5 can be arranged in any convenient configuration to provide a desired heating pattern on the PCB.

For particular heating patterns, different individually controlled groups of resistors can be arranged across the PCB. Heat can then be supplied in different amounts to different regions of the PCB. Similarly, more than one temperature sensor may be provided.

The heating layer 3 can be provided by the normal conduction layer of the PCB, or by the normal earthing layer of the board and so can be within the board layers.

Alternatively, an additional copper heating layer can be provided which is exclusively used for heating the electronic components mounted on the board.

Figure 2:
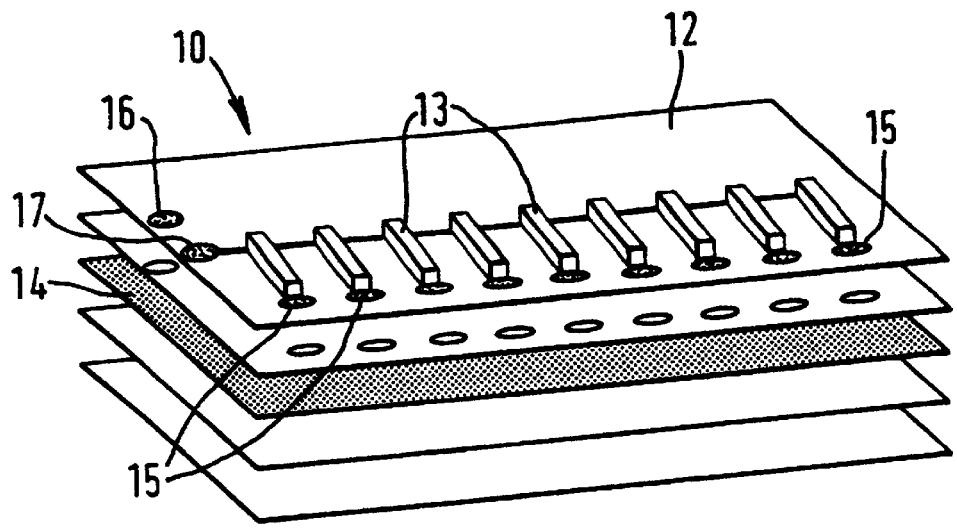
FIG. 2 shows a second printed circuit board embodying the present invention.

FIG. 2 shows a view of a second PCB 10 embodying the present invention. The PCB 10 has an insulating upper layer 12 on which are arranged a number of surface mount resistors 13. Within the board there is provided a copper layer 14. The resistors 13 are in thermal contact with the copper layer 14 by way of a plurality of via holes 15.

When a voltage is applied, by way of connectors 16 and 17, to the resistors 13, they heat up so that heat is transferred to the copper layer 14. This in turn raises the temperature of the whole PCB 10.

The voltage supplied to the resistors can be controlled in dependence upon an output from a temperature sensor (not shown), as in the FIG. 1 circuit board.

What is claimed is:
1. A printed circuit board comprising:
   a multi-layered structure including a substrate layer, a ground layer and a conducting layer, the ground and conducting layers being isolated from one another by an insulating layer, one of the layers of the structure providing a heating layer such that heat applied to the heating layer is transferred to electronic components mounted on the printed circuit board;
   a plurality of surface mount resisters mounted in contact with the heating layer;

a controlled voltage source for providing a control voltage to the resistors; and at least one temperature sensor mounted on the board for providing at least one temperature signal representing a temperature of a region of the board to the controlled voltage source;

wherein one of the ground and conducting layers provides the heating layer, wherein the resistors are arranged in a plurality of groups, and wherein the controlled voltage source is operable to provide respective control voltages to the groups of surface mount resistors in dependence upon the at least one temperature signal, each group being individually controlled by the control voltage source.

* * * * *